United States Patent [19]
Drynan

[11] Patent Number: 6,054,771
[45] Date of Patent: Apr. 25, 2000

[54] INTERCONNECTION SYSTEM IN A SEMICONDUCTOR DEVICE

[75] Inventor: John Mark Drynan, Tokyo, Japan

[73] Assignee: NEC Corporation, Japan

[21] Appl. No.: 09/014,892

[22] Filed: Jan. 28, 1998

[30] Foreign Application Priority Data

Jan. 31, 1997 [JP] Japan ................................. 9-017972

[51] Int. Cl.[7] ........................... H01L 23/48; H01L 23/52; H01L 29/40
[52] U.S. Cl. ........................... 257/764; 257/750; 257/758
[58] Field of Search .................................... 257/764, 750, 257/758

[56] References Cited

U.S. PATENT DOCUMENTS

| | | | |
|---|---|---|---|
| 5,345,108 | 9/1994 | Kikkawa | 257/751 |
| 5,506,449 | 4/1996 | Nakano et al. | 257/758 |
| 5,811,851 | 9/1998 | Nishioka et al. | 257/750 |
| 5,939,788 | 8/1999 | McTeer | 257/751 |

FOREIGN PATENT DOCUMENTS

| | | | |
|---|---|---|---|
| 57-155775 | 9/1982 | Japan | H01L 29/78 |
| 59-39049 | 3/1984 | Japan | H01L 21/88 |

OTHER PUBLICATIONS

"TiN as a Diffusion Barrier in the Ti–Pt–Au Beam–Lead Metal System" Garceau et al The Solid FIlms, 60 (1979); pp. 237–247.

Primary Examiner—Mahshid Saadat
Assistant Examiner—Jhihan B. Clark
Attorney, Agent, or Firm—Hayes, Soloway, Hennessey, Grossman & Hage, P.C.

[57] ABSTRACT

An interconnection system in a semiconductor device comprises a $Ti_2N$ film having a lower resistivity and a higher thermal stability at a higher temperature compared to a TiN film. The $Ti_2N$ film is formed by rapid thermal annealing of a TiN film and a Ti film consecutively formed on an insulator film. The rapid thermal treating is effected in a nitrogen ambient at a substrate temperature of 700 to 900° C. for 30 to 120 seconds.

4 Claims, 5 Drawing Sheets

6,054,771

INTERCONNECTION SYSTEM IN A SEMICONDUCTOR DEVICE

BACKGROUND OF THE INVENTION (a) Field of the Invention

The present invention relates to an interconnection system in a semiconductor device and, more particularly, to a new metallic interconnection system having a $Ti_2N$ compound. The present invention also relates to a method for manufacturing such a semiconductor device.

(b) Description of the Related Art

Finer pattern for an interconnection system, as well as higher-integration and miniaturization for device elements, has been intensively developed in semiconductor devices such as DRAMs. For the finer pattern of the interconnection system, it is proposed that silicide on polysilicon (polycide) and tungsten silicide be used for gate electrodes or word lines and bit lines, respectively, in a DRAM. In this structure, polycide is generally used for contacts between bit lines and source/drain regions of MOSFETs constituting memory cells as well as for contacts for capacitors.

With the advance of further higher integration and miniaturization, there arises the problem in that the resistivity of the tungsten silicide or polycide tends to decrease the operational speed of the semiconductor device, and accordingly, a new conductive material is desired having a lower resistivity and a higher stability at a higher temperature.

Patent Publication JP-A-7(1995)-155775 proposes that titanium nitride (TiN) be used in a single conductive layer as a high-melting compound instead of tungsten silicide and polyicide and that gate electrodes or interconnection systems in MISFETs be formed also by TiN. In this publication, however, instability of TiN during a heat treatment is not recited.

Patent Publication JP-A-59(1984)-39049 proposes that a nitride, boride or carbide of a transition metal such as titanium (Ti), zirconium (Zr) and vanadium (V) be used for an interconnection system in a semiconductor device. It is also proposed therein that, since the nitride of a transition metal exhibits a higher resistivity in a direct contact with a semiconductor layer, the contact resistance be reduced by interposing a pure transition metal between the semiconductor layer and the nitride.

In JP-A-59-39049, it is not mentioned that the nitride of transition metal has a larger resistivity than the pure transition metal to increase the overall resistance. In addition, only TiN is recited as an example of nitrides and the instability of TiN during a heat treatment is not recited therein.

An article in "Thin Solid Films", 60(1979) pp. 237–247 by W. J. Garceau et al., teaches that a TiN layer interposed between Ti and Pt is effective as a diffusion barrier for preventing formation of Ti—Pt intermetallic compounds. It is also recited that the resistivity of TiN changes with the function of nitrogen content: the resistivity increases up to about 100 $\mu\Omega \cdot cm$ with the increase of nitrogen between zero and 35 at. % of nitrogen and, with a discontinuity, dramatically decreases down to about 40 $\mu\Omega \cdot cm$ with a small amount of increase in nitrogen content above 35 at. %.

In the article as mentioned above, TiN is not recited as an underlying layer for the interconnection system, and the thermal stability of TiN after the dramatic change in the resistivity is not mentioned therein.

SUMMARY OF THE INVENTION

It is an object of the present invention to provide a new interconnection system in a semiconductor device having a lower resistivity, a higher thermal stability and an excellent adherence onto an insulator film, compared to a TiN film.

It is another object of the present invention to provide a method for forming the interconnection system as mentioned above.

The present invention provides a semiconductor device comprising a semiconductor substrate, an insulator film overlying the semiconductor substrate, and an interconnection pattern formed on the insulator film and including a $Ti_2N$ film.

The present invention also provides a method for manufacturing a semiconductor device having an interconnection system comprising the steps of forming a TiN film overlying a semiconductor substrate, forming a Ti film on the TiN film, and thermal treating the TiN film and the Ti film to form a $Ti_2N$ film from the TiN film and the Ti film.

In accordance with the semiconductor device according to the present invention and manufactured by the method according to the present invention, a new interconnection system comprising a $Ti_2N$ film is obtained, which has a lower resistivity and a higher thermal stability as well as an excellent adhesion onto an insulator film.

The above and other objects, features and advantages of the present invention will be more apparent from the following description, referring to the accompanying drawings.

PREFERRED EMBODIMENTS OF THE INVENTION

Figure 1A:
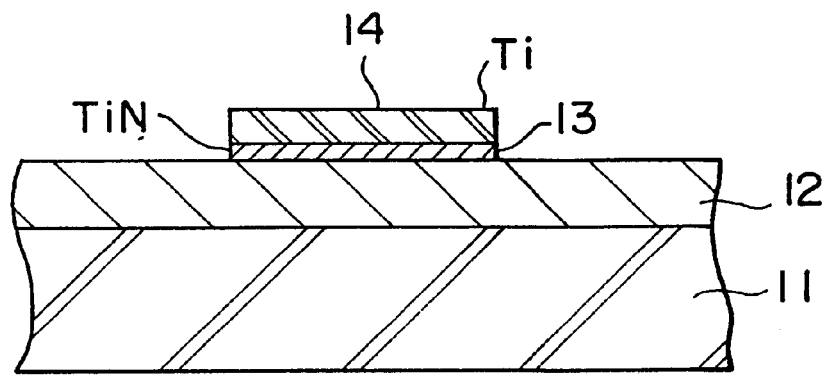
FIGS. 1A and 1B are cross-sectional views of a semiconductor device having an interconnection system according to a first embodiment of the present invention in consecutive steps of fabrication thereof.

Now, the present invention is more specifically described with reference to accompanying drawings, wherein similar constituent elements are designated by the same or similar reference numerals.

Referring to FIG. 1A, in the manufacture of a semiconductor device having an interconnection system according to a first embodiment of the present invention, an insulator film 12 made of $SiO_2$ is first formed on a silicon substrate 11. Then, a blanket TiN film is formed on the entire surface of the $SiO_2$ film 12 by sputtering or chemical vapor deposition (CVD), followed by formation of a Ti film similarly by using a sputtering or CVD technique on the TiN film.

Subsequently, both the TiN film and the Ti film are subjected to a selective etching using a dry etching or wet etching technique to leave on the insulation film 12 an interconnection pattern having a two layer (TiN/Ti) structure including a TiN film pattern 13 and a Ti film pattern 14. In this example, both the TiN film and the Ti film are preferably consecutively deposited by the same deposition technique, i.e, either a sputtering or a CVD technique, without switching between these deposition techniques.

Figure 1B:
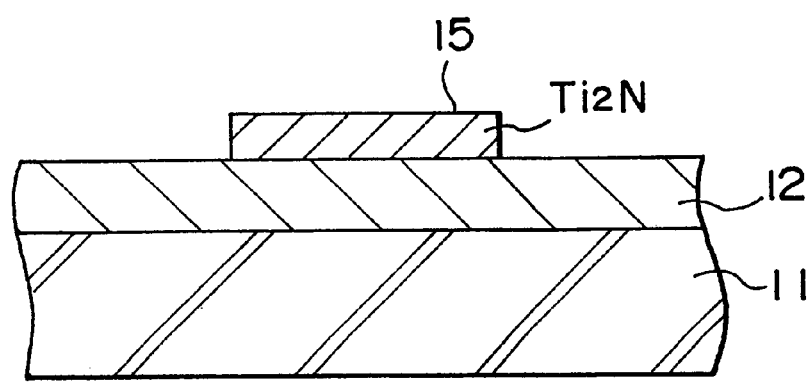

The resultant device shown in FIG. 1 is subjected to a heat treatment or rapid thermal annealing (RTA) for the TiN film 13 and the Ti film 14 in a nitrogen ambient at a substrate temperature between about 700° C. and about 900° C. for a time length between about 30 seconds and about 120 seconds. In this heat treatment, nitrogen in the TiN film 13 and in the nitrogen ambient is diffused into the Ti film 14 to form a $Ti_2N$ film 15 from both the TiN film 13 and the Ti film 14, wherein the atomic ratio of Ti to N both in the as-deposited TiN film 13 and Ti film 14 becomes substantially 2:1 after the annealing, as shown in FIG. 1B. The $Ti_2N$ film 15 thus formed was thermally stable and exhibited substantially no adverse change in the characteristics thereof after several heat treatments for fabrication of a multi-level interconnection system. In FIG. 1B, a small-thickness TiN film may be left between the insulator film 12 and the $Ti_2N$ film 15 after the annealing.

Figure 2:
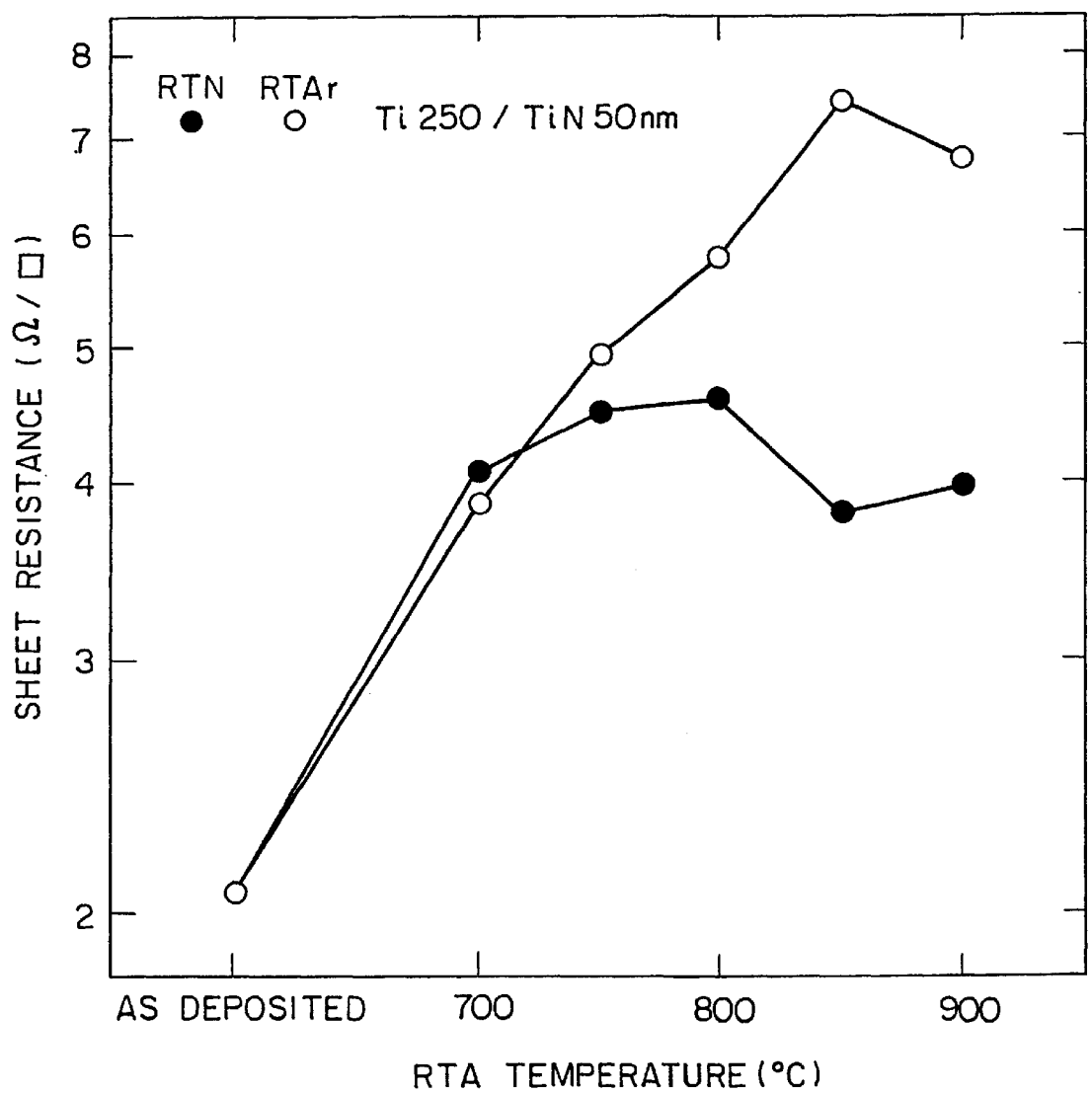
FIG. 2 is a graph for showing sheet resistances of a TiN film and a Ti film against annealing temperature in a rapid thermal annealing.

The present inventors conducted experiments for investigating the change in the sheet resistance in samples of the first embodiment to confirm the advantage of the present invention, the results of which are shown in FIG. 2, wherein the sheet-resistance is plotted against temperatures in the rapid thermal annealing conducted to the samples.

Each of the samples had a 2-layer film including a 50 nm-thick TiN film on the bottom and a 250 nm-thick Ti film on the top, both of which were blanket films. One group of the samples were subjected to rapid thermal annealing in a nitrogen ambient (RTN) for 30 seconds at temperatures from 700° C. to 900° C., and other group to rapid thermal annealing in an argon ambient (RTAr) at similar temperatures.

The as-deposited 2-layer film had a sheet resistance of about 2 $\Omega$/square, as shown in FIG. 2. The RTAr to the samples provided poor sheet resistances for the resultant films which increased up to 7 $\Omega$/square, whereas the RTN to the samples maintained an acceptable sheet resistance for the resultant films, which was about 4 $\Omega$/square and therefore suitable for use as a conductive film in a DRAM.

The difference in the results is attributable to the nitrogen ambient and the argon ambient. Specifically, with rapid thermal annealing in argon to the 2-layer film, the N diffused from the first TiN film is insufficient to form low resistance $Ti_2N$. With rapid thermal annealing in nitrogen, however, a $Ti_2N$ film is produced at least in portions of both the Ti and TiN films by thermal diffusion of nitrogen into the Ti film from the ambient as well as from the TiN film.

Figure 3A:
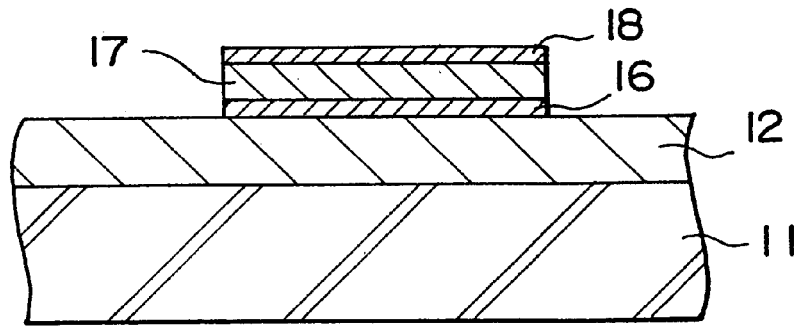
FIGS. 3A and 3B are cross-sectional views of a semiconductor device comprising an interconnection system according to a second embodiment of the present invention in consecutive steps of fabrication thereof.
Figure 3B:
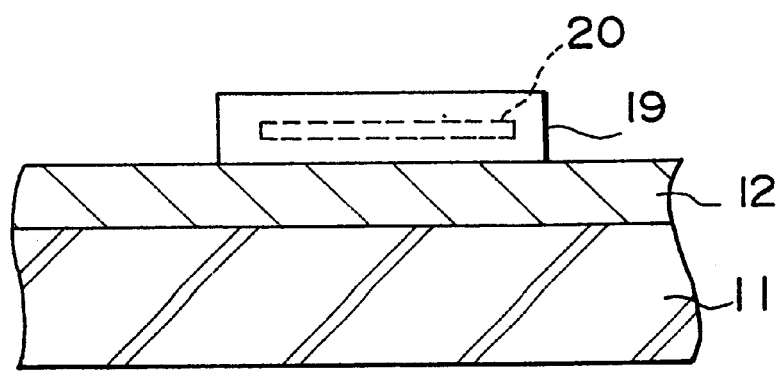

Referring to FIG. 3A, in the manufacture of a semiconductor device having an interconnection system according to a second embodiment of the present invention, a $SiO_2$ film 12 is formed on a semiconductor substrate 11, followed by consecutively forming thereon a first TiN film, a Ti film and a second TiN film by sputtering or CVD.

Subsequently, the resultant films are subjected to a selective etching using a dry etching or wet etching technique to leave an interconnection pattern on the insulation film 12 having a three-layer structure (TiN/Ti/TiN) including a first TiN film pattern 16, a Ti film pattern 17 and a second TiN film pattern 18.

Thereafter, the interconnection pattern is subjected to a RTN or RtAr step at a temperature between 700° C. and 900° C. for about 30 seconds to thermally diffuse nitrogen from the first and second TiN film patterns 16 and 18 into the Ti film pattern 17. As a result, the Ti film pattern 17 as well as the first and second TiN film patterns 16 and 18 changes to a $Ti_2N$ film pattern 19 except for a central portion 20 of the Ti film pattern 17 which remains as the Ti film. The resultant interconnection pattern has a lower resistivity and a higher thermal stability compared to a TiN film because the main portion of the interconnection pattern is made of $Ti_2N$.

In the above configuration, the entire interconnection pattern including the central portion 20 of the Ti film 17 may be changed to the $Ti_2N$ film 19 by conducting the rapid thermal annealing for a longer time length or adjusting the Ti and TiN film thicknesses.

Figure 4:
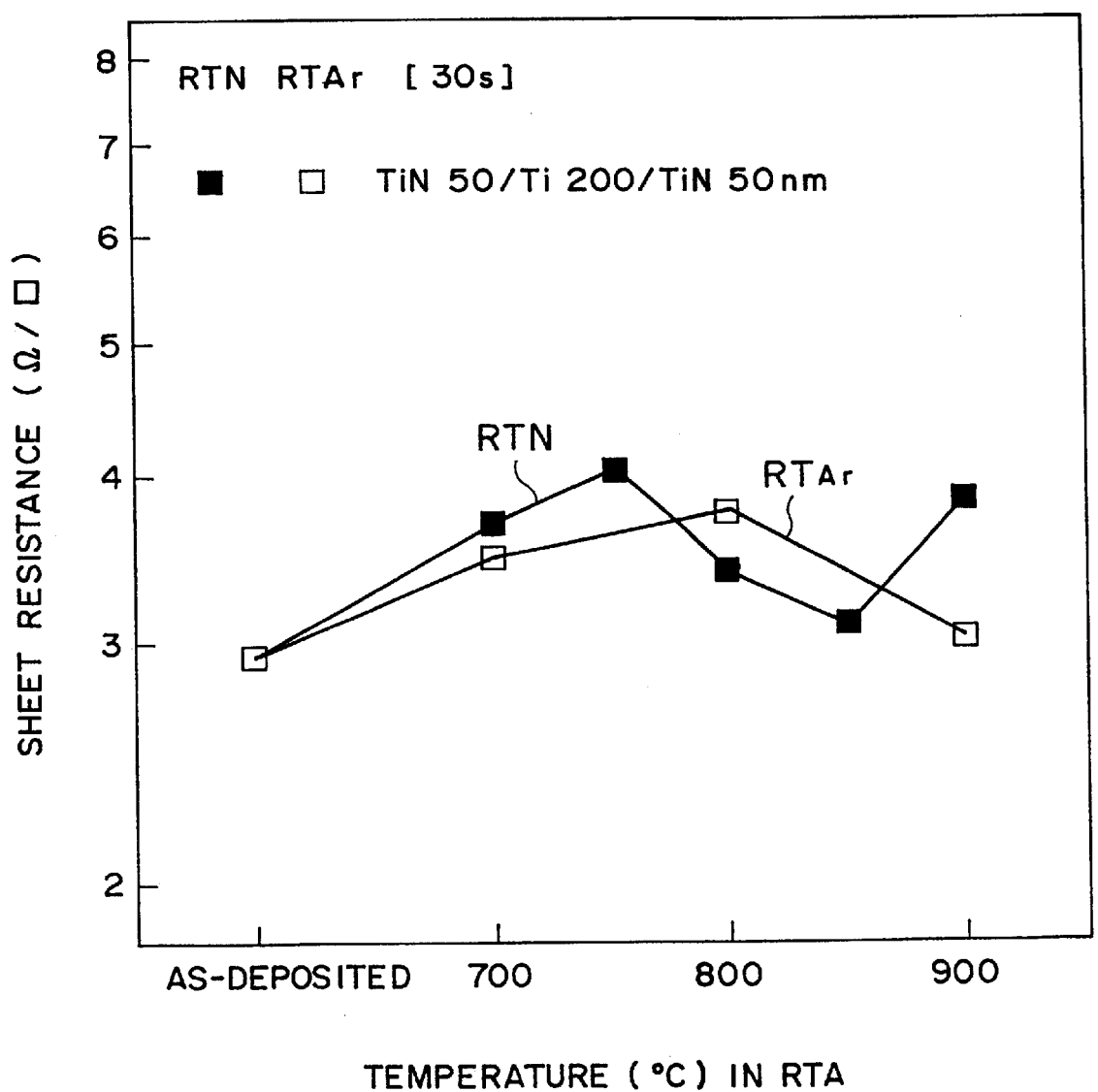
FIG. 4 is a graph for showing sheet resistance of TiN/Ti/TiN films against annealing temperature in a rapid thermal annealing.

Referring to FIG. 4, experiments conducted to samples of the second embodiment showed excellent results, wherein each of the samples had a 50 nm-thick first TiN film, a 200 nm-thick Ti film and a 50 nm-thick second TiN film, all of which were blanket films. Rapid thermal annealing was conducted to the samples in an argon ambient or a nitrogen ambient at temperatures between 700° C. and 900° C. for 30 seconds. As shown in FIG. 4, with increasing temperature, the resultant sheet resistance peaks at about 4 $\Omega$/square but then decreases to about 3 $\Omega$/square at about 100° C.-higher temperature. The sharp decrease in resistance at temperature above 750° C. for RTN and about 800° C. for RTAr indicate the production of low-resistance $Ti_2N$ within the 3-layer film. This decrease occurs at lower temperature for RTN due to nitrogen diffusion from the ambient in addition to that from the first and second TiN films. Some other samples were also subjected to RTN for a time length between about 30 seconds and about 120 seconds, and exhibited further reduction in resistance due to increased nitrogen diffusion and hence production of a $Ti_2N$ film.

Figure 5:
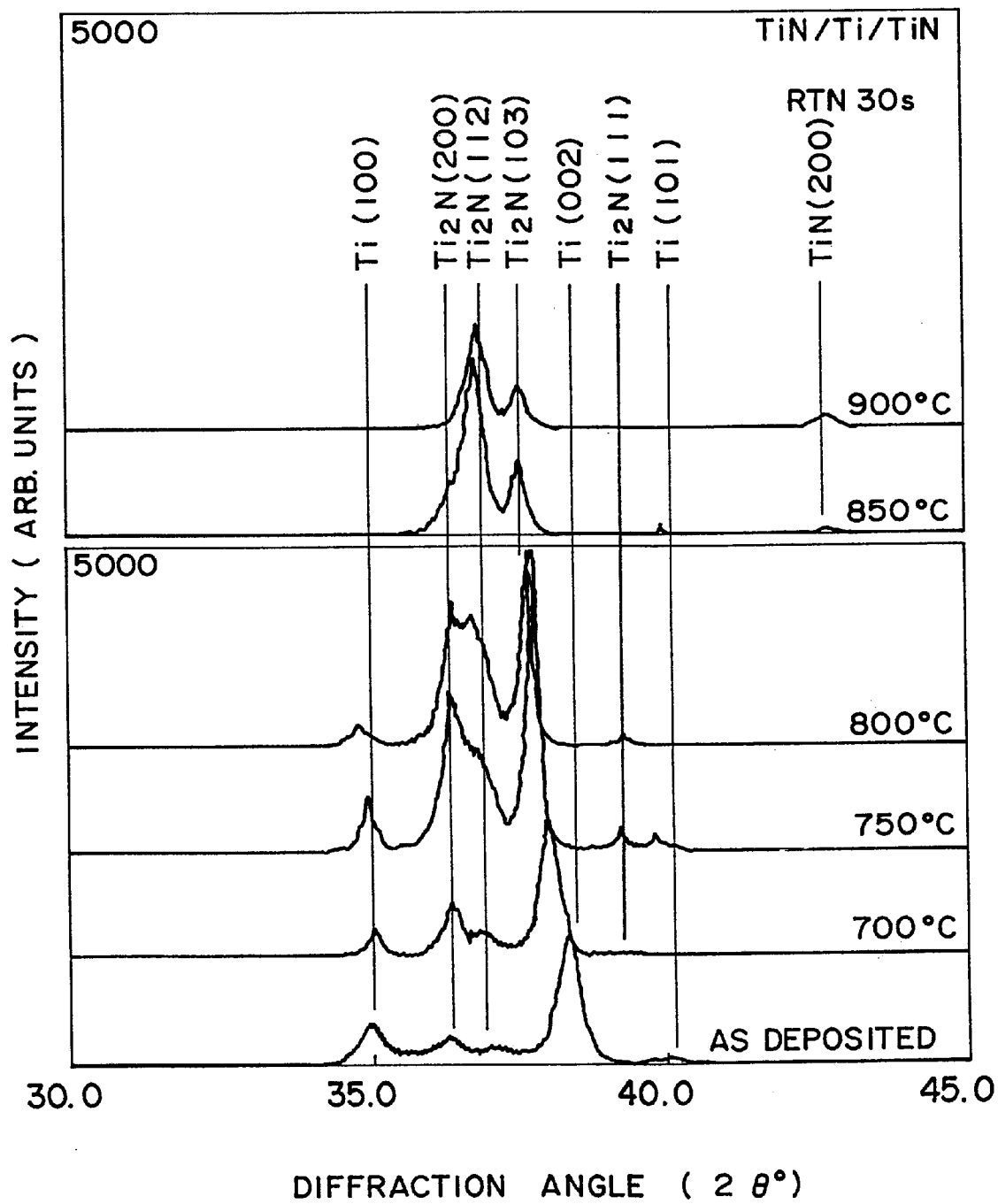
FIG. 5 is an X-ray diffraction spectrum diagram after annealing TiN/Ti/TiN films for revealing the constituents and crystal orientation of the interconnection system according to the second embodiment of the present invention.

Referring to FIG. 5, there are shown spectrum diagrams observed by X-ray diffraction of the interconnection system according to the second embodiment. In FIG. 5, light intensity is plotted against diffraction angle (2θ) for the structure as-deposited, and after rapid thermal annealing at 700° C., 750° C., 800° C., 850° C. and 900° C. The as-deposited films exhibited strong peaks at diffraction angles corresponding to (100) and (002) orientations of Ti originating from the Ti film, and exhibited stronger peaks after the annealing at the diffraction angles corresponding to $Ti_2N$ as the temperature of the rapid thermal annealing increased. In addition, the spectra exhibit stronger peaks at (103), (112) and (200) orientations among other orientations of $Ti_2N$ as the temperature increased. Further, it was revealed that Ti was not substantially left or generated after the thermal annealing.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a semiconductor substrate, an insulator film overlying said semiconductor substrate, and an interconnection pattern formed on said insulator film and including a $Ti_2N$ film.

2. A semiconductor device as defined in claim 1, wherein said interconnection pattern further includes a TiN film between said insulator film and said $Ti_2N$ film.

3. A semiconductor device as defined in claim 1, wherein said interconnection pattern has a sheet resistance of below 4 $\Omega$/square for an interconnection pattern thickness of 300 nm.

4. A semiconductor device as defined in claim 1, wherein said interconnection pattern has a Ti film within said $Ti_2N$ film.

* * * * *